| (12) | United States Patent | (10) Patent No.: | US 12,368,128 B2 |
|---|---|---|---|
| | Chen et al. | (45) Date of Patent: | Jul. 22, 2025 |

(54) DEVICE BONDING APPARATUS AND METHOD OF MANUFACTURING A PACKAGE USING THE APPARATUS

(71) Applicant: Taiwan Semiconductor Manufacturing Co., Ltd., Hsinchu (TW)

(72) Inventors: Yi-Jung Chen, Yilan (TW); Tsung-Fu Tsai, Changhua (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 460 days.

(21) Appl. No.: 17/895,321

(22) Filed: Aug. 25, 2022

(65) Prior Publication Data

US 2024/0071982 A1    Feb. 29, 2024

(51) Int. Cl.
*H01L 29/66*    (2006.01)
*H01L 23/00*    (2006.01)
(Continued)

(52) U.S. Cl.
CPC .............. *H01L 24/74* (2013.01); *H01L 24/80* (2013.01); *H01L 21/56* (2013.01);
(Continued)

(58) Field of Classification Search
CPC ......... H01L 24/74; H01L 24/80; H01L 21/56; H01L 23/3185; H01L 23/3192; H01L 24/05; H01L 24/08; H01L 2224/05624; H01L 2224/05647; H01L 2224/08145; H01L 2224/80203; H01L 2224/808; H01L 21/568; H01L 2224/74; H01L 23/3128; H01L 23/3135; H01L 23/3171
See application file for complete search history.

(56) References Cited

U.S. PATENT DOCUMENTS 11,152,328 B2 *   10/2021   Ma ........................... H01L 24/75
11,637,082 B2      4/2023   Ma et al.
(Continued)

FOREIGN PATENT DOCUMENTS

TW    200410356 A    6/2004
TW    201802867 A    1/2018
(Continued)

*Primary Examiner* — Niki H Nguyen
(74) *Attorney, Agent, or Firm* — Slater Matsil, LLP

(57) ABSTRACT

In an embodiment, a device bonding apparatus is provided. The device bonding apparatus includes a first process station configured to receive a wafer; a first bond head configured to carry a die to the wafer, wherein the first bonding head includes a first rigid body and a vacuum channel in the first rigid body for providing an attaching force for carrying the die to the wafer; and a second bond head configured to press the die against the wafer, the second bond head including a second rigid body and an elastic head disposed over the second rigid body for pressing the die, the elastic head having a center portion and an edge portion surrounding the center portion, the center portion of the elastic head having a first thickness, the edge portion of the elastic head having a second thickness, the second thickness being greater than the second thickness.

20 Claims, 12 Drawing Sheets

(51) Int. Cl.
  *H01L 21/56* (2006.01)
  *H01L 23/31* (2006.01)
(52) U.S. Cl.
  CPC ...... *H01L 23/3185* (2013.01); *H01L 23/3192* (2013.01); *H01L 24/05* (2013.01); *H01L 24/08* (2013.01); *H01L 2224/05624* (2013.01); *H01L 2224/05647* (2013.01); *H01L 2224/08145* (2013.01); *H01L 2224/74* (2013.01); *H01L 2224/80203* (2013.01); *H01L 2224/808* (2013.01)

(56) References Cited

U.S. PATENT DOCUMENTS

| | | |
|---|---|---|
| 11,764,198 B2 | 9/2023 | Wimplinger |
| 2018/0366434 A1* | 12/2018 | McClain ............. H01L 21/4853 |
| 2023/0356520 A1* | 11/2023 | Ramaswamy ........ B32B 43/006 |
| 2023/0395413 A1 | 12/2023 | Jun et al. |

FOREIGN PATENT DOCUMENTS

| | | |
|---|---|---|
| TW | 202044536 A | 12/2020 |
| TW | 202121610 A | 6/2021 |
| TW | 202129836 A | 8/2021 |

* cited by examiner

DEVICE BONDING APPARATUS AND METHOD OF MANUFACTURING A PACKAGE USING THE APPARATUS

BACKGROUND

The packages of integrated circuits are becoming increasing complex, with more device dies packaged in the same package to achieve more functions. For example, a package structure has been developed to include a plurality of device dies such as processors and memory cubes in the same package. The package structure can bond device dies, which are formed using different technologies and have different functions, to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
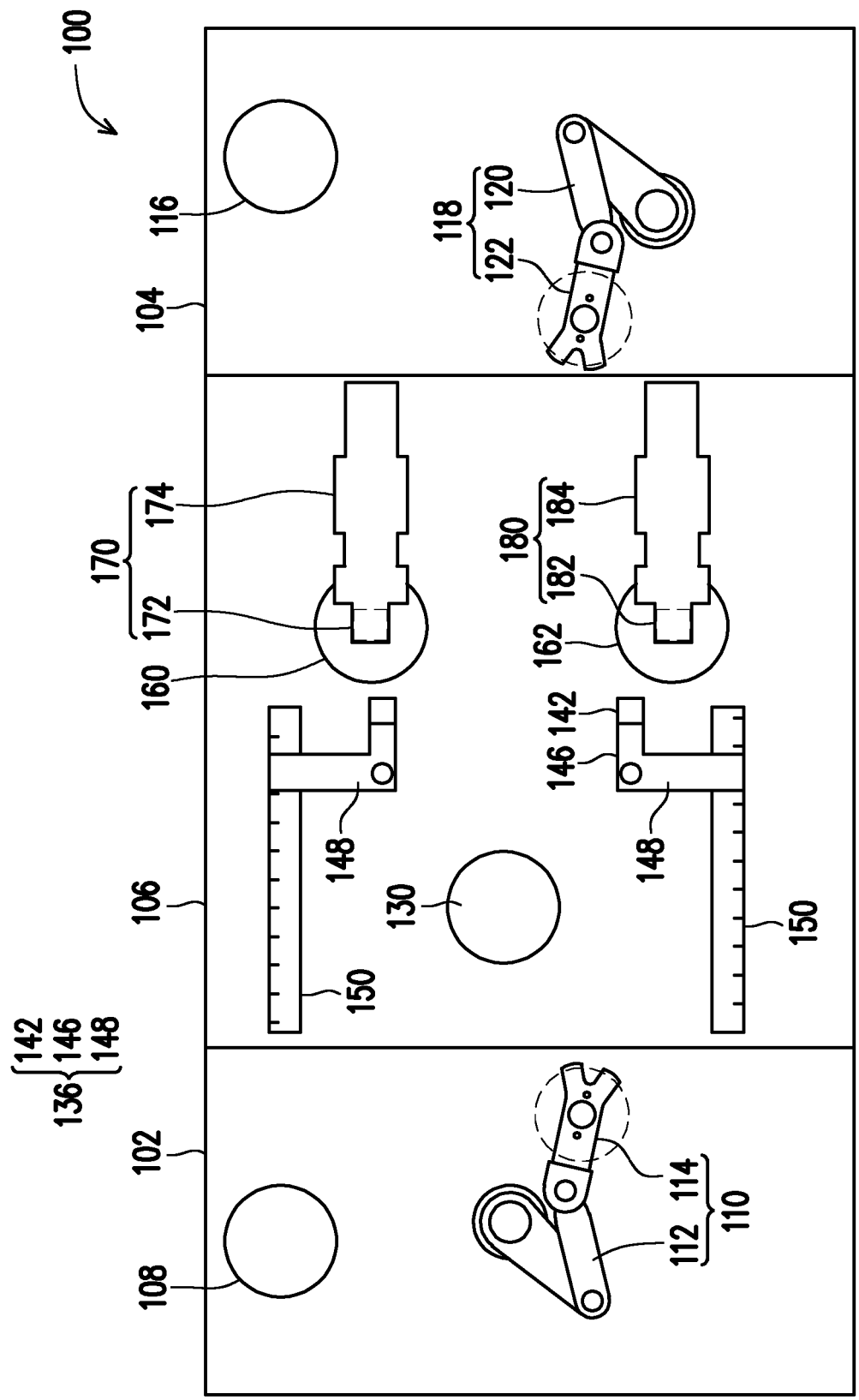
FIG. 1 is a plan view of a device bonding apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device bonding apparatus and a method of forming a package using the device bonding apparatus are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

The embodiments of the present disclosure have some advantageous features. A device bonding apparatus is provided in accordance with some embodiments. The device bonding apparatus includes two types of bond heads for applying a two-stage pre-anneal bonding process when bonding a semiconductor die and a wafer. By applying the two-stage pre-anneal bonding process, gaps between edge portions of the semiconductor die and the wafer resulting from the warpage of the semiconductor die may be reduced or eliminated. Thus, the process yield and reliability of the bonding between the semiconductor die and the wafer may be improved.

FIG. 1 illustrates a plan view of a device bonding apparatus 100 in accordance with some embodiments. The device bonding apparatus 100 includes a first chamber 102, a second chamber 104, and a third chamber 106. The first chamber 102 and the second chamber 104 may each be a wafer loading/unloading chamber. The third chamber 106 may be a processing chamber for performing device bonding. The third chamber 106 is disposed between the first chamber 102 and the second chamber 104 and may receive devices, such as wafers, transferred from the first chamber 102 and the second chamber 104.

In some embodiments, the first chamber 102 includes a load port 108 and a robot 110. A wafer or a cassette of wafers may be introduced into the first chamber 102 through the load port 108, which is often referred to as a loading station for loading or unloading the wafer or the cassette of wafers. The robot 110 is configured to transfer a wafer from the load port 108 to the third chamber 106, e.g., to a die-picking station in the third chamber 106. The robot 110 may include a robot arm 112 and a robot blade 114. In some embodiments, the robot arm 112 is equipped with dual arms or a single arm. The robot blade 114 may be configured to carry the wafer. In some embodiments, the second chamber 104 includes a load port 116 and a robot 118. A wafer or a cassette of wafers is introduced into the second chamber 104 through the load port 116, which is also often referred to as a loading station for loading or unloading the wafer or the cassette of wafers. The robot 118 is configured to transfer a wafer from the load port 116 to the third chamber 106, e.g., to a process station in the third chamber 106. The robot 118 includes a robot arm 120 and a robot blade 122. In some embodiments, the robot arm 120 is equipped with dual arms or a single arm. The robot blade 122 may be configured to carry the wafer.

The third chamber 106 includes one or more die-picking station 130, one or more die collectors 136, one or more first process stations 160, one or more second process stations 162, one or more first bonding mechanisms 170, and one or more second bonding mechanisms 180, in accordance with some embodiments. For illustrative purposes, one die-picking station 130, two die collectors 136, one first process station 160, one second process station 162, one first bonding mechanism 170, and one second bonding mechanism 180 are illustrated in FIG. 1, although any number of these stations, collectors, and bonding mechanisms in the third chamber 106 may be implemented and used in accordance with some embodiments.

Figure 2:
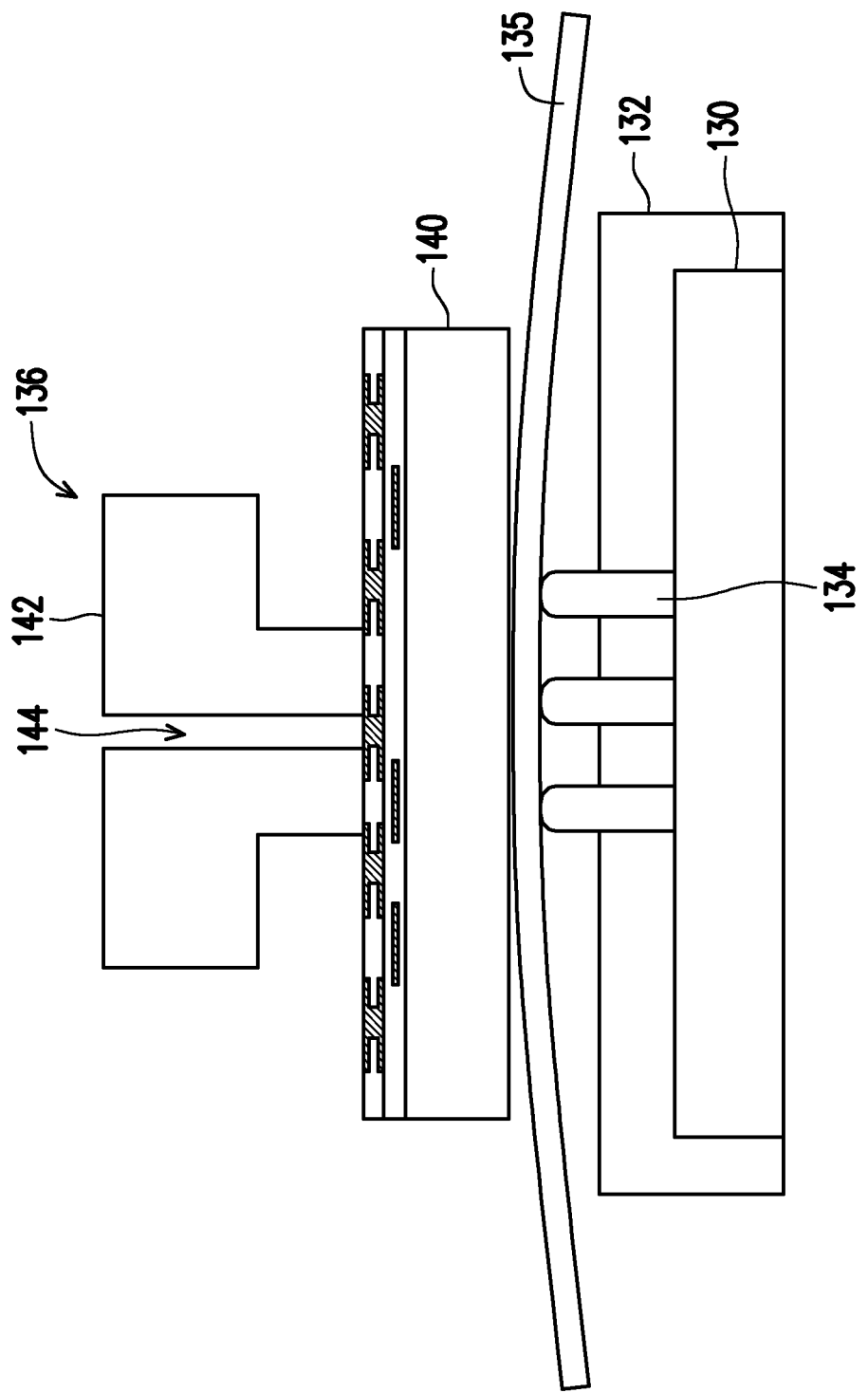
FIG. 2 is a cross-sectional view of a die-picking station and a die collector of a device bonding apparatus at an intermediate stage of collecting a semiconductor die from the die-picking station in accordance with some embodiments.

The die-picking station 130 may receive and sustain a wafer transferred from the first chamber 102, for example, by the robot 110. A die collector 136 may collect a singulated device from the wafer sustained in the die-picking station 130. FIG. 2 illustrates a cross-sectional view of the die-picking station 130 and the die collector 136 at the intermediate stage that the die collector 136 is collecting a singulated device 140 (e.g., a semiconductor die) from a wafer in the die-picking station 130, in accordance with some embodiments. The die-picking station 130 includes a plurality of ejectors 132 (only one is illustrated in FIG. 2) and a plurality of needles 134 on respective one of the ejectors 132. The plurality of the needles 134 may sustain the wafer. The ejector 132 may be elevated so as to elevate the needles 134, such that the needles 134 eject the singulated device 140 from a tape 135. The die collector 136 may include sensors (not shown) for detecting the elevated singulated device 140. In some embodiments, the die collector 136 also includes a collector head 142 and a vacuum channel 144 embedded in the collector head 142. The collector head 142 may include a material, such as resins (e.g., epoxy resins), rubbers, or a combination thereof. The vacuum channel 144 may be exposed at a bottom surface of the collector head 142 (e.g., the surface facing the singulated device 140, as illustrated in FIG. 2). The die collector 136 may create a vacuum environment in the vacuum channel 144 and provide an attaching force (e.g., a suction force) for collecting the singulated device 140 from the die-picking station 130. In some embodiments, the bottom surface of the collector head 142 is a flat surface and has a surface area of 3 mm$^2$ to 500 mm$^2$.

Referring back to FIG. 1, in some embodiments, the die collector 136 includes a first arm 146 connected to the collector head 142 and a second arm 148 connected to the first arm 146. An end of the second arm 148 may be connected to the first arm 146 by a pivot, and the other end of the second arm 148 may be connected to a rail 150. In some embodiments, the first arm 146 and the collector head 142 may be rotated with respect to the second arm 148 and/or the rail 150, such as rotating 180 degrees with respect to the first arm 146 or the rail 150, and the collector head 142 may be flipped over after the rotation. The rail 150 may extend along a direction extending toward and away from its adjacent process station 160 or 162. The second arm 148 may be slid on the rail 150 for moving the die collector 136 toward or away from the first or second process station 160 or 162.

The first process station 160 and the second process station 162 are disposed adjacent to the die-picking station 130. The first process station 160 and the second process station 162 may each receive a wafer, such as wafers transferred from the second chamber 104 by the robot 118. In some embodiments, the first process station 160 and the second process station 162 may be used for performing a pre-anneal bonding process. For example, the first process station 160 or the second process station 162 may be configured to sustain a wafer against a downward force applied to the wafer.

In some embodiments, the first bonding mechanism 170 includes a first bond head 172 connected to an arm 174. The arm 174 may be configured to move first bond head 172 to a desired position in the third chamber 106, such as by controlling the horizontal and vertical positions of the first bond head 172. For example, the arm 174 may move the first bond head 172 to a location near the die-picking station 130 for collecting the singulated device 140 from the die collector 136 and placing the singulated device 140 on a wafer in the first process station 160 or the second process station 162. In some embodiments, the arm 174 is configured to move the first bond head 172 vertically and provide a downward force against a device 140 and/or the wafer in the first process station 160 or the second process station 162. The cross-sectional view of the first bond head 172 will be illustrated in FIG. 4.

In some embodiments, the second bonding mechanism 180 includes a second bond head 182 connected to an arm 184. The arm 184 may be configured to move the second bond head 182 to a desired position in the third chamber 106, such as by controlling the horizontal and vertical positions of the second bond head 182. For example, the arm 184 may move the second bond head 182 to the first process station 160 or the second process station 162. In some embodiments, the arm 184 is configured to move the second bond head 182 vertically and provide a downward force against a device 140 and/or the wafer in the first process station 160 or the second process station 162. The cross-sectional view of the second bond head 182 will be illustrated in FIG. 7A.

FIGS. 3-6, 7A, and 8-11 illustrate cross-sectional views of intermediate stages in manufacturing a semiconductor package in accordance with some embodiments. In some embodiments, the manufacturing of the semiconductor package includes pre-anneal bonding processes, anneal processes, and post-bonding processes. The pre-anneal bonding processes may be performed in the device bonding apparatus 100 as illustrated in FIG. 1. The resulting bonds may be hybrid bonds, although other types of bonds may be formed.

Figure 3:
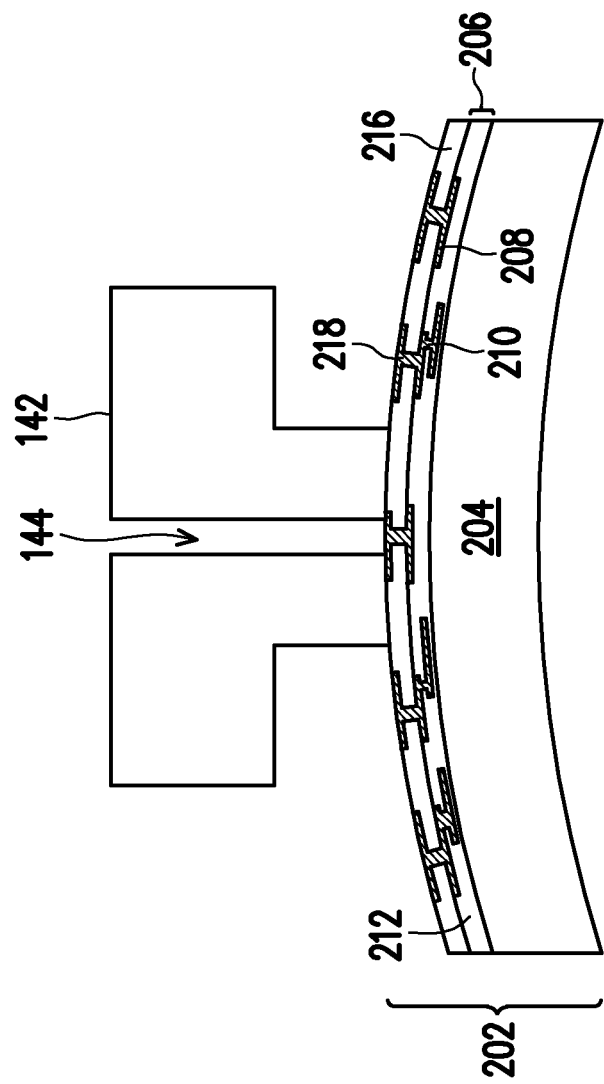
FIGS. 3, 4, 5, 6, 7A, 8, 9, 10, and 11 are cross-sectional views at intermediate stages of manufacturing a semiconductor package in accordance with some embodiments.

Referring to FIG. 3, a semiconductor die 202 is collected by a collector 136, in accordance with some embodiments. The semiconductor die 202 may be collected from a first wafer. The first wafer may be loaded from the load port 108 and transferred to the die-picking station 130 by the robot 110 as illustrated in FIG. 1. The first wafer may include a plurality of the semiconductor dies 202, and at least a portion of them are identical to each other. In some embodiments, the first wafer is a singulated wafer. The semiconductor dies 202 in the first wafer may be singulated and separated from each other. A tape 135 (see FIG. 2) may be attached to the bottom of the first wafer (e.g., inactive surfaces of semiconductor dies 202 in the first wafer) for supporting these separated semiconductor dies 202. In some embodiments, the semiconductor dies 202 are ejected by ejector 132 of the die-picking station 130 and collected by the die collector 136. In some embodiments, the semiconductor die 202 faces up when it is collected by the die collector 136, and an active surface of the semiconductor die 202 may be in contact with the die collector 136.

In some embodiments, the semiconductor die 202 is a device die including active devices such as transistors and/or diodes, and possibly passive devices such as capacitors, inductors, resistors, or the like. In accordance with some embodiments of the present disclosure, the semiconductor die 202 is a logic die, which may be a Central Processing Unit (CPU) die, a Micro Control Unit (MCU) die, an input-output (IO) die, a BaseBand (BB) die, or an Application processor (AP) die. The semiconductor die 202 may also be a memory die such as a Dynamic Random Access Memory (DRAM) die or a Static Random Access Memory (SRAM) die.

In some embodiments, the semiconductor die 202 includes a semiconductor substrate 204 and features formed over a top surface of the semiconductor substrate 204. The semiconductor substrate 204 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 204 may also be a bulk silicon substrate or a Silicon-On-Insulator (SOI) substrate. Shallow Trench Isolation (STI) regions (not shown) may be formed in the semiconductor substrate 204 to isolate the active regions in the semiconductor substrate 204.

An interconnect structure 206 is disposed over the semiconductor substrate 204 in accordance with some embodiments. The interconnect structure 206 includes metal lines 208 and vias 210 formed in one or more levels of dielectric layers 212. The dielectric layers 212 may be alternatively referred to as inter-metal dielectric (IMD) layers or inter-layer dielectric (ILD) layers. In accordance with some embodiments of the present disclosure, at least the lower ones of dielectric layers 212 are formed of a low-k dielectric material having a dielectric constant (k-value) lower than about 3.0, about 2.5, or even lower. The dielectric layers 212 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance some embodiments, some or all of the dielectric layers 212 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 212 includes depositing a porogen-containing dielectric material, and then performing a curing process to drive out the porogen, and hence the remaining dielectric layers 212 are porous. Etch stop layers (not shown), which may be formed of silicon carbide, silicon nitride, or the like, are formed between the dielectric layers 212, and are not shown for simplicity.

The metal lines 208 and the vias 210 are formed in the dielectric layers 212. The metal lines 208 at a same level are collectively referred to as a metal layer hereinafter. In accordance with some embodiments of the present disclosure, the interconnect structure 206 includes a plurality of layers of metal lines 208 that are interconnected through vias 210. The metal lines 208 and vias 210 may be formed of copper or copper alloys, and they can also be formed of other metals. The formation process may include single damascene and dual damascene processes. In an exemplary single damascene process, a trench is first formed in one of the dielectric layers 212, followed by filling the trench with a conductive material. A planarization process such as a CMP process is then performed to remove the excess portions of the conductive material higher than the top surface of the dielectric layer 212, leaving a metal line in the trench. In a dual damascene process, both a trench and a via opening are formed in a dielectric layer 212, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

A surface dielectric layer 216 is disposed over the interconnect structure 206 in accordance with some embodiments. The surface dielectric layer 216 may be formed of a non-low-k dielectric material such as silicon oxide. The surface dielectric layer 216 is alternatively referred to as a passivation layer since it has the function of isolating the underlying low-k dielectric layers (if any) from the adverse effect of detrimental chemicals and moisture. The surface dielectric layer 216 may also have a composite structure including more than one layer, which may be formed of silicon oxide, silicon nitride, Undoped Silicate Glass (USG), or the like. The semiconductor die 202 may also include metal pads such as aluminum or aluminum-copper pads, Post-Passivation Interconnect (PPI), or the like, formed between the surface dielectric layer 216 and the interconnect structure 206 or in the surface dielectric layer 216, which are not shown for simplicity.

Bond pads 218 are formed in the surface dielectric layer in accordance with some embodiments. In accordance with some embodiments of the present disclosure, the bond pads 218 are formed through a single damascene process, and may also include barrier layers and a copper-containing material formed over the barrier layers. In some embodiments, the surface dielectric layer 216 and the bond pads 218 are planarized so that their top surfaces are coplanar, which may be the result of a CMP performed in the formation of the bond pads 218. Although not shown, through-vias, sometimes referred to as through-semiconductor vias or through silicon vias (TSVs), may be formed to extend into the semiconductor substrate 204. The through-vias are used to electrically inter-couple the features on opposite sides of the semiconductor die 202, such as electrically connecting the metal lines 208 and vias 210 formed on the front side of the semiconductor substrate 204 to the backside of the semiconductor substrate 204.

Figure 4:
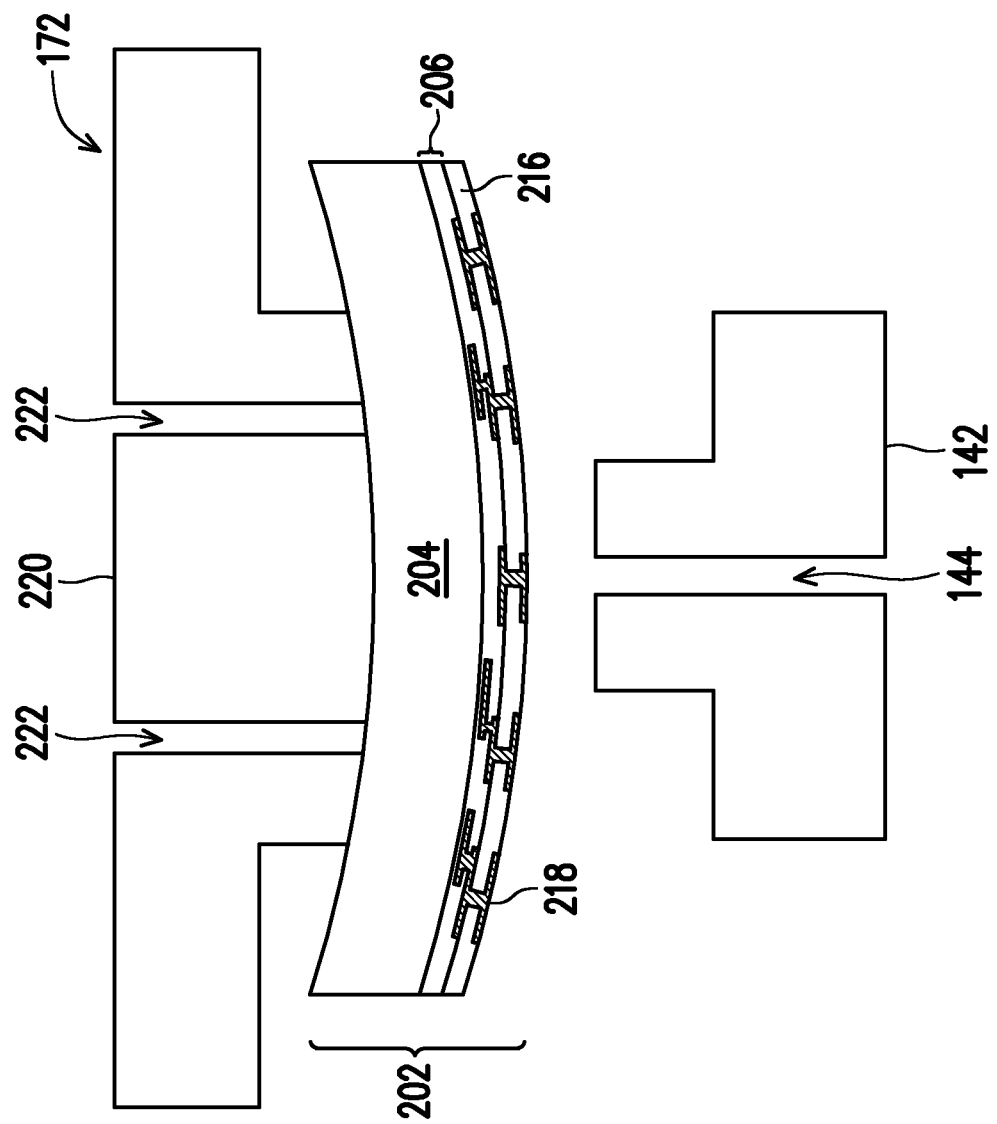

In FIG. 4, the semiconductor die 202 is flipped over and picked up by the first bonding mechanism 170 (see FIG. 1), in accordance with some embodiments. For example, the collector head 142 and the first arm 146 of the die collector 136 may rotate about 180 degrees with respect to the second arm 148 or the rail 150 as illustrated in FIG. 1. As such, the semiconductor die 202 is flipped over and moved to a position near the first process station 160 or the second process station 162. After the semiconductor die 202 is flipped over, the first bonding mechanism 170 may move to pick the semiconductor die 202 up through the first bond head 172.

In some embodiments, the first bond head 172 includes a rigid body 220 and one or more vacuum channels 222 embedded in the rigid body 220. In some embodiments, the rigid body 220 of the first bond head 172 includes a rigid material, such as ceramics, suitable metal materials such as stainless steel, the like, or a combination thereof. The vacuum channels 222 may be exposed at a bottom surface of the rigid body 220 (e.g., the surface facing the semiconductor die 202). The vacuum channels 222 may create a vacuum environment in the vacuum channels 222 and provide an attaching force (e.g., a suction force) for picking the semiconductor die 202 and carrying the semiconductor die 202 to various locations. For example, the transferring of the semiconductor die 202 from the die collector 136 to the first bond head 172 may include stopping providing the attaching force from the collector 136, and the first bond head 172 picking the semiconductor die 202 up using the attaching force provided by the vacuum channels 222. When attaching the semiconductor die 202 to the first bond head 172, the inactive surface of the semiconductor die 202 faces the first bond head 172 and may contact the rigid body 220 of the first bond head 172.

In some embodiments, the semiconductor die 202 may be warped, either caused by its inherent characteristics or by the attaching force of the first bond head 172. In some embodiments, the semiconductor die 202 has a saddle shape and has a curved bottom surface (e.g., the surface of the semiconductor die 202 facing down as in FIG. 4). For example, the bottom surface of the semiconductor die 202 may have a convex shape in its center portion and may have a saddle shape or mountain shape in a cross-sectional view.

Figure 5:
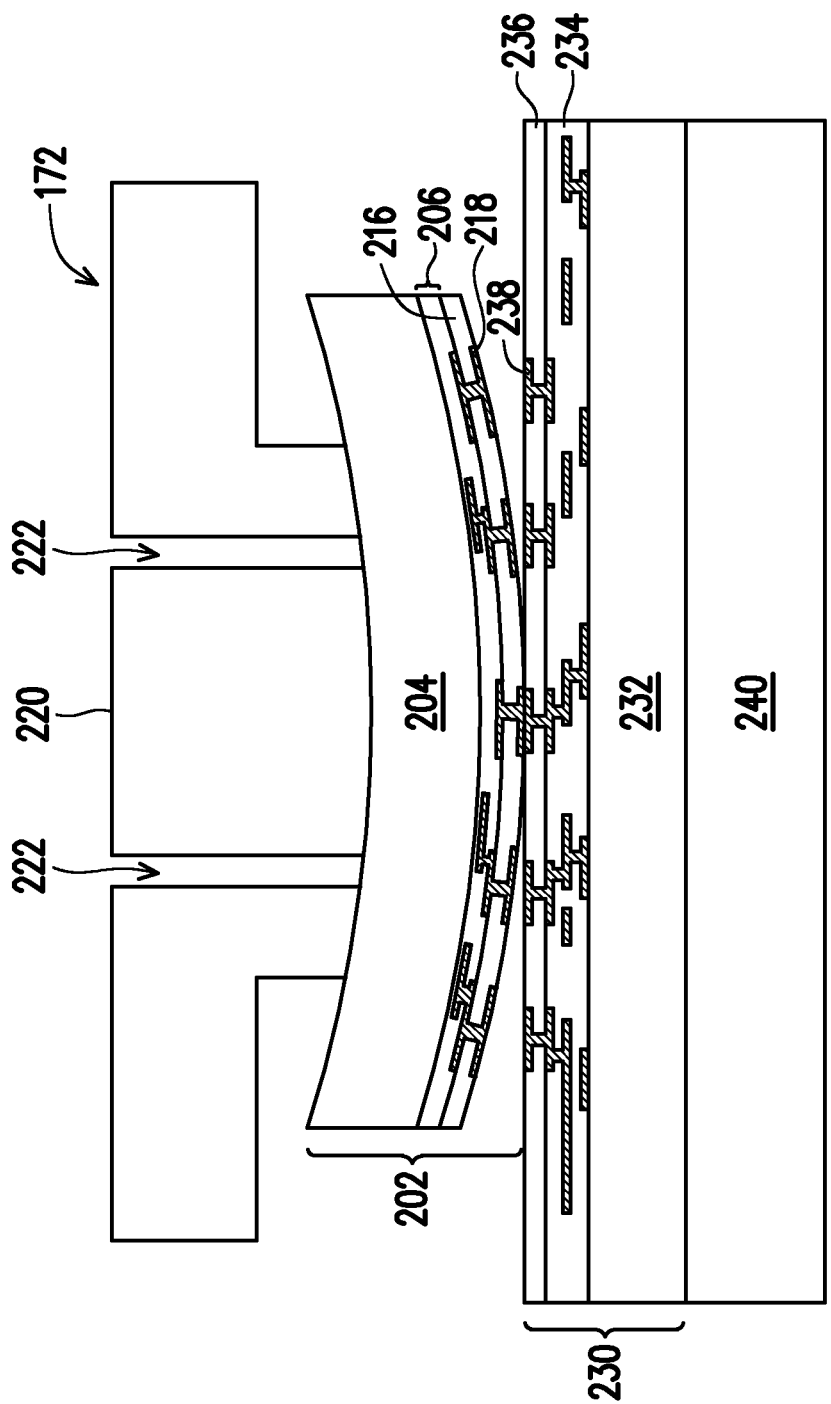

In FIG. 5, the first bonding mechanism 170 (see FIG. 1) places the semiconductor die 202 over a second wafer, in accordance with some embodiments. In some embodiments, the second wafer is placed in the first process station 160 (or the second process station 162), which may be transferred from the load port 116 by the robot 118. The second wafer 230 may be a device wafer. For example, the second wafer may include a plurality of semiconductor dies. The semiconductor dies of the second wafer 230 may be a logic die, which may be a Central Processing Unit (CPU) die, a Micro Control Unit (MCU) die, an input-output (IO) die, a Base-Band (BB) die, or an Application processor (AP) die. The semiconductor die may also be a memory die such as a Dynamic Random Access Memory (DRAM) die or a Static Random Access Memory (SRAM) die. In some embodiments, the semiconductor dies of the second wafer 230 may include a similar structure to the semiconductor die 202, though their feature sizes and functions (e.g., circuit designs) may be the same or different. For example, the second wafer 230 may include a semiconductor substrate 232, an interconnect structure 234 disposed over the semiconductor substrate 232, a surface dielectric layer 236 disposed over the interconnect structure 234, and bond pads 238 disposed in the surface dielectric layer 236, which may include similar materials and structures to those the of semiconductor substrate 204, the interconnect structure 206, the surface dielectric layer 216, and the bond pads 218 of the semiconductor die 202, respectively, except at a wafer level. In some embodiments, through-vias (not shown) are formed in the semiconductor substrate 232. In some embodiments, a carrier substrate 240, such as a glass wafer or silicon blank wafer, may be attached to the second wafer. In some embodiments, the second wafer is not singulated yet, so that the plurality of semiconductor dies of the second wafer 230 are connected to each other. In some embodiments, the placement of the semiconductor die 202 includes aligning the bond pads 218 of the semiconductor die 202 to the bond pads 238 of the second wafer 230.

Figure 6:
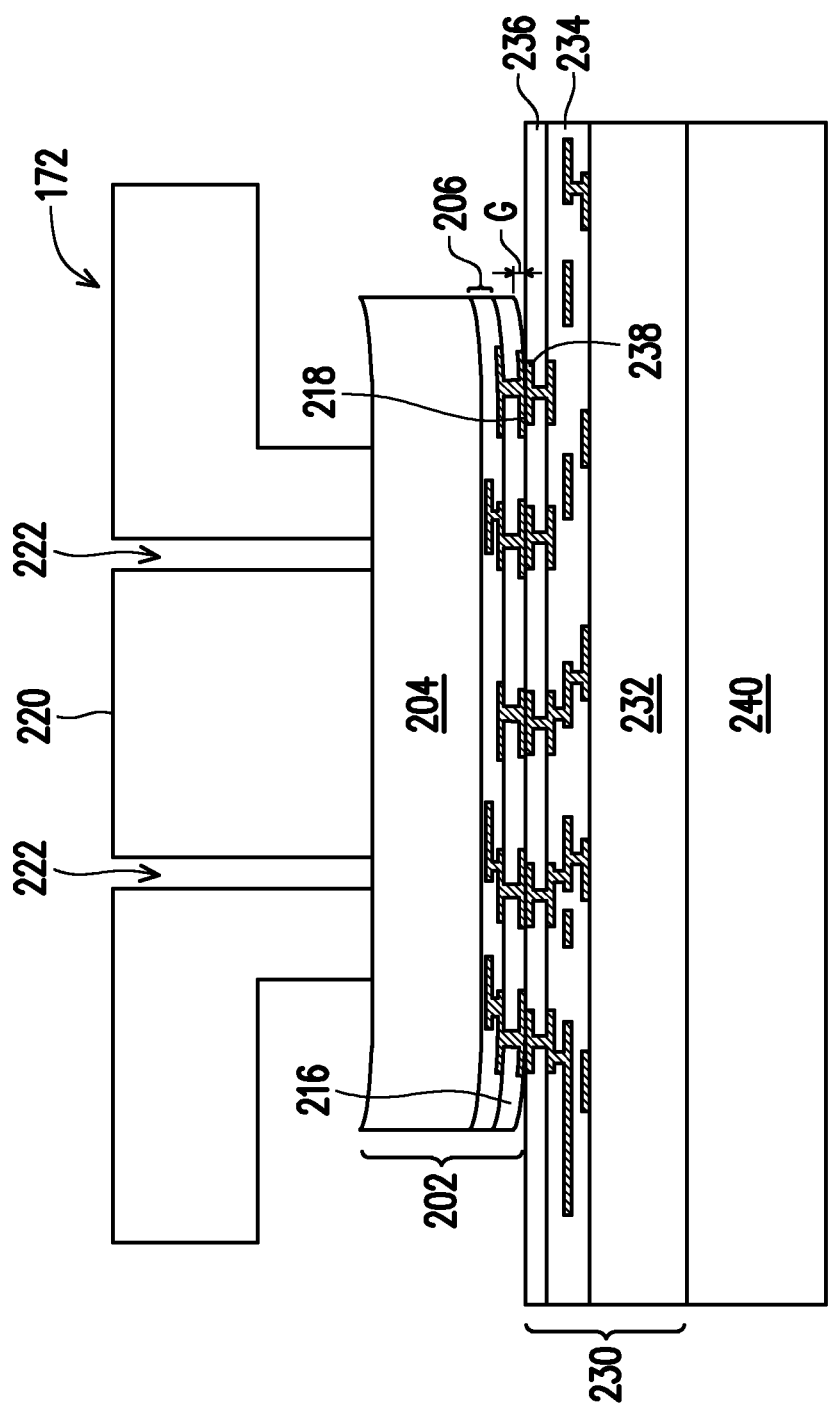

In FIG. 6, a first pre-anneal bonding process is performed on the semiconductor die 202 through the first bond head 172, in accordance with some embodiments. The first pre-anneal bonding process may include applying a first downward force on the semiconductor die 202 and against the second wafer 230. In some embodiments, the first pre-bonding process is carried out at a temperature of 0° C. to 150° C., such as at about room temperature. In some embodiments, the first bond head 172 has a surface area smaller than the inactive surface of the semiconductor die 202, and the first downward force is applied on a center portion of the semiconductor die 202. The first downward force may be 1 N to 30 N, and may be applied for about 3 seconds, such as 0.5 to 5 seconds. As such, the semiconductor die 202 is pressed against the second wafer 230, which may prevent the semiconductor die 202 from slipping. The first downward face may also reduce an extent of warpage of the semiconductor die 202. However, in some embodiments, gaps G may remain between the edge portions of the semiconductor die 202 and the second wafer 200 because the first downward force is substantially applied to the center portion of the semiconductor die 202, and the material of the first bond head 172 may limit the magnitude of the first downward force that can be applied to the semiconductor die 202. If a subsequently formed dielectric layer (e.g., dielectric layer 260, See FIG. 9) were to extend into the gaps G, it may block the electrical connections between the bond pads 218 and the bond pads 238, and may generate stress to break apart the bonds between the semiconductor die 202 and second wafer 230. As will be described below, a second pre-anneal bonding process will be performed to eliminate (or at least reduce) the gaps G so that the subsequently formed dielectric layer does not extend into the gaps G.

Figure 7A:
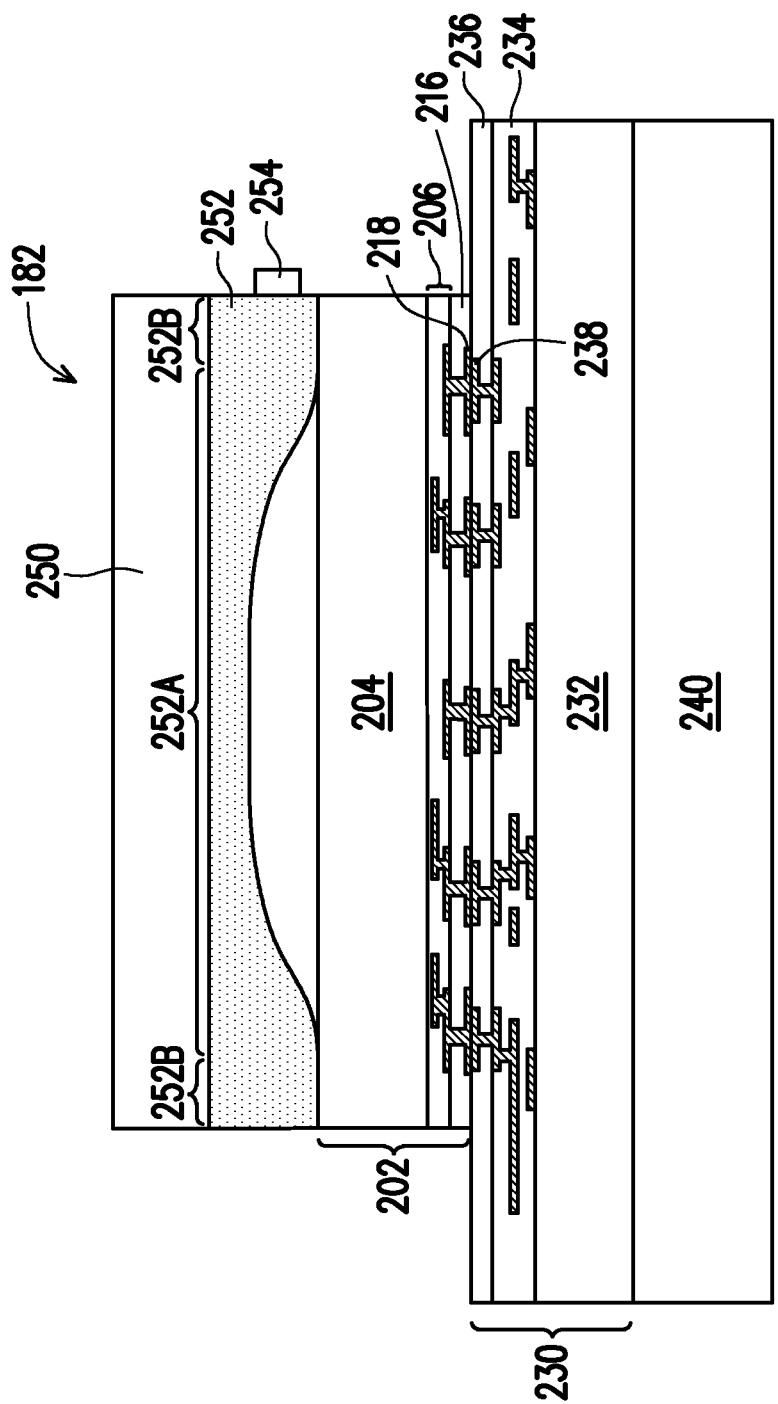

Referring to FIG. 7A, a second pre-anneal bonding process is performed on the semiconductor die 202 by the second bond head 182, in accordance with some embodiments. The second pre-anneal bonding process may include applying a second downward force on the semiconductor die 202 through a second bond head 182 and against the second wafer 230, in accordance with some embodiments. As such, the semiconductor die 202 is pressed against the second wafer 230. The second downward force may be 20 N to 50 N. The second downward force is greater than the first downward force, such as 1.5 to 20 times the first downward force. In some embodiments, the second downward force may be applied for about 3 seconds, such as 0.5 to 10 seconds. In some embodiments, the second pre-bonding process is carried out at a temperature of 0° C. to 150° C., such as at about room temperature. As illustrated in FIG. 7A, in some embodiments, the second bond head 182 includes a rigid body 250 and an elastic head 252 disposed over the rigid body 250. The rigid body 250 may include a heating device (not shown), which may heat the rigid body 250 and the elastic head 252 to a desired temperature, such as over 150° C. The elastic head 252 faces away from the rigid body 250 and towards the semiconductor die 202. The elastic head 252 may have a center portion 252A and an edge portion 252B surrounding the center portion 252A. In some embodiments, the center portion of the elastic head 252 may have a curved bottom surface that is concave, such as having a bowl shape. More specifically, the center portion 252A has a first thickness, and the edge portions 252B have a second thickness, wherein the second thickness is greater than the first thickness. The edge portions 252B may have a substantially flat bottom surface (e.g., the surface facing the rigid body 250).

The rigid body 250 may include a rigid material, such as ceramics, suitable metal materials such as stainless steel, the like, or combinations thereof. In some embodiments, the rigid body 250 of the second bond head 182 is formed of a same material as the rigid body 220 of the first bond head 172. The elastic head 252 may include elastic rubber or other elastomers. For example, the elastic head 252 may include butyl rubber, fluorine-based rubber, acrylic rubber, acrylonitrile-butadiene-styrene rubber, natural rubber, isoprene rubber, styrene-butadiene rubber, butadiene rubber, urethane rubber, syndiotactic 1,2-polybutadiene, epichlorohydrin-based rubber, polysulfide rubber, polynorbornene rubber, thermoplastic elastomers (e.g., polystyrene-based, polyolefin-based, polyvinyl chloride-based, polyurethane-based, polyamide-based, polyurea-based, polyester-based, and fluororesin-based thermoplastic elastomers), combinations thereof, or the like. The material of the elastic head 252 has greater elasticity than the material of the rigid body 250. The elastic head 252 may be formed by any suitable processes (e.g., molding or 3D printing). The elastic head 252 may be attached to the rigid body 250 through an adhesive layer or directly formed on the rigid body 250. In some embodiments, the elastic head 252 is portable and able to be removed from the rigid body 250.

Figure 7B:
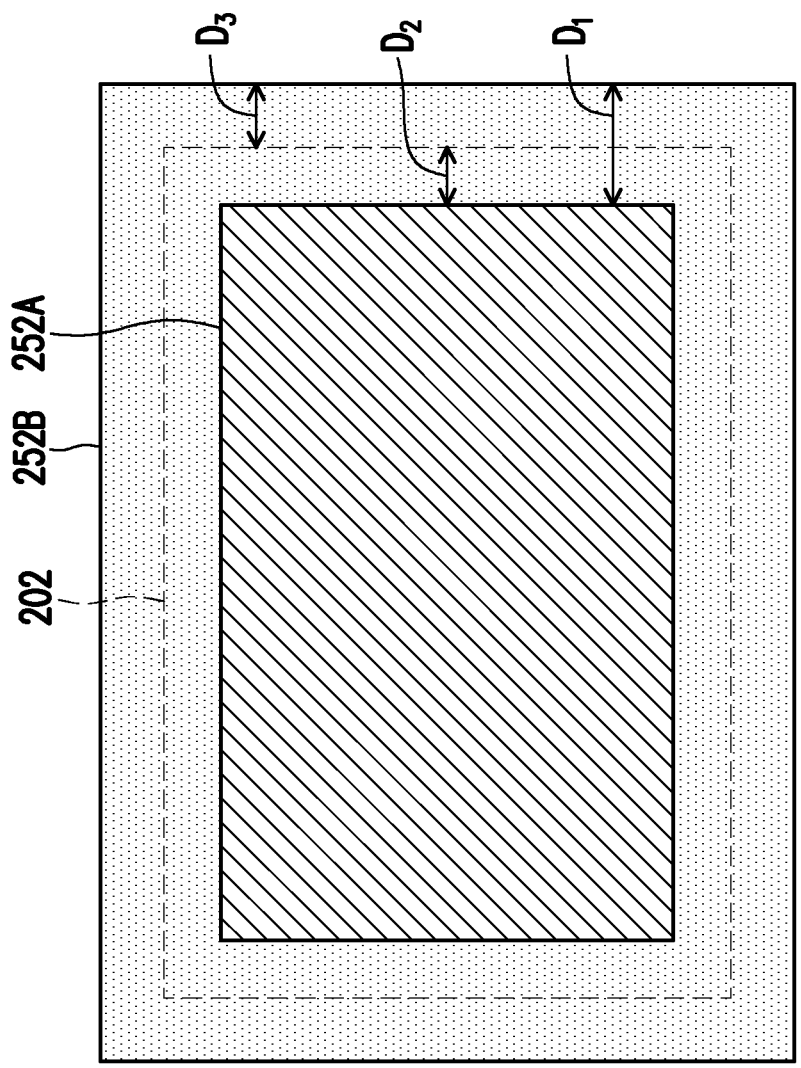
FIG. 7B is a plan view of a bond head and a semiconductor die at an intermediate stage of performing a pre-anneal bonding process in accordance with some embodiments.

FIG. 7B illustrates a plan view of the semiconductor die 202 and the elastic head 252 of the second bond head 182 while the second pre-anneal bonding process (as illustrated in FIG. 7A) is performed, in accordance with some embodiments. In FIG. 7B, the edge portion 252B of the elastic head 252 may surround the center portion 252A of the elastic head 252 and has a ring shape in the plan view. The ring shape may have rectangular, rounded rectangular, or circular inner corners. In some embodiments, the edge portion 252B may have a width $D_1$ ranging from 200 µm to 10000 µm. In the second pre-anneal bonding process, the elastic head 252 of the second bond head 182 may contact at least a portion of the semiconductor die 202 (illustrated in ghost). Specifically, the edge portion 252B of the elastic head 252 contacts the edge of the semiconductor die 202, while the center portion 252A of the elastic head 252 is spaced apart from the center portion of the semiconductor die 202. The contact area between the elastic head 252 and the semiconductor die 202 may have a width $D_2$, measured from the inner edge of the edge portion 252B of the elastic head 252 to an edge of the semiconductor die 202. The width $D_2$ may be 100 µm to 5000 µm, which may be ⅓ to ⅔ of the width $D_1$. The contact area is less than the surface area of the semiconductor die 202. The suitable width $D_2$ and the contact area between the elastic head 252 and the semiconductor die 202 may allow the second bond head 182 to generate sufficient pressure on the semiconductor die 202 by a suitable second downward force that may not damage the semiconductor die 202. In some embodiments, a width $D_3$ from the edge of the semiconductor die 202 to an outer edge of the elastic head 252 is 100 µm to 5000 µm, which may create a buffer area for aligning the second bond head 182 to the semiconductor die 202, thereby improving the success rate of the second pre-anneal bonding process. With a suitable pressure given on the edge portion 252B of the semiconductor die 202 through the second bond head 182, the gaps G (see FIG. 6) between the semiconductor die 202 and the second wafer 200 may be reduced or eliminated, thereby improving the process yield and reliability of the bonds between the semiconductor die 202 and the second wafer 200.

In some embodiments, the first pre-anneal bonding process and the second pre-anneal bonding process may be performed in situ, e.g., in the same first process station 160. In an embodiment, a first pre-anneal bonding process and a second pre-anneal bonding process may be performed alternatingly at a same process station. For example, the first pre-anneal bonding process may be performed in the first process station 160. Next, the first bond head 172 may move away after the first pre-anneal bonding process is performed, such as heading to a location near the die-picking station 130 for picking up another semiconductor die of the first wafer. Then, the second bond head 182 may move to the first process station 160 for performing the second pre-anneal bonding process on the semiconductor die 202 and the second wafer 230 in the first process station 160. The first bond head 172 further moves to the second process station 162 for performing the first pre-bonding process for another set of the semiconductor die 202 and the second wafer 230 in the second process station 162 while the second bond head 182 is performing the second pre-anneal bonding process in the first process station 160. The second bond head 182 may then move to the second process station 162 for performing the second pre-bonding process in the second process station 162. Because no transportation is needed between the first and second pre-anneal bonding processes, the risk of the semiconductor die 202 being damaged in transportation is reduced.

In some embodiments, the first pre-anneal bonding process and the second pre-anneal bonding process may be performed in different process stations. For example, the first pre-anneal bonding process may be performed in the first process station 160, and the second pre-anneal bonding process may be performed in the second process station 162. After applying the first pre-anneal bonding process in the first process station 160, the semiconductor die 202 and the second wafer 230 may be transported to the second process station 162 by a robot (not shown in FIG. 1) in the third chamber 106 for performing the second pre-anneal bonding process by the second bond head 182. In such embodiments, the traveling distances of the first bond head 172 and the second bond head 182 may be reduced, which saves traveling time of the first bond head 172 and the second bond head 182 and may increase processing throughput.

In some embodiments, the second bond head 182 also includes one or more sensors 254 disposed on a sidewall of the rigid body 250 of the second bond head 182. The sensor 254 may be an optical sensor configured to measure a tilt angle of the second wafer 230 with respect to the surface of the rigid body 250 facing the elastic head 252. In some embodiments, when the tilt angle of the second wafer 230 with respect to the surface of the rigid body 250 is greater than 0 or an angle required by the process, such as over 3 degrees or other suitable angles, the process station (e.g., the process station 160 or 162) may adjust the tilt angle of the second wafer 230. As such, the sensor 254 may aid the second downward face applied on the second wafer 230 to be distributed uniformly, thereby reducing or preventing the potential damages occurred on the die 202 and the second wafer 230 when performing the second pre-anneal process.

Figure 8:
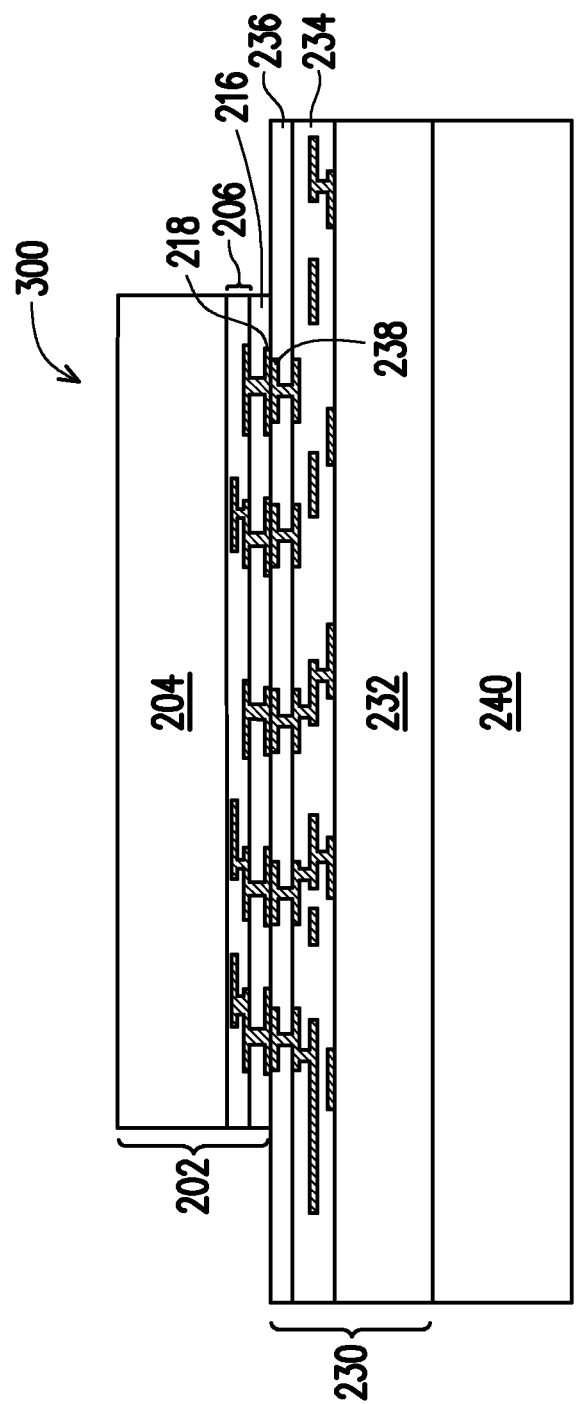

Although FIGS. 3 to 7B show pre-anneal bonding processes of one semiconductor die 202 to the second wafer 230, it is appreciated that the pre-anneal bonding processes may be performed at a wafer level, and a plurality of the semiconductor dies 202 may be arranged in rows and columns on the second wafer 230 by repeating the processes illustrated in FIGS. 3 to 7B. A semiconductor package 300 may be formed. The semiconductor package 300 is in a wafer form and not singulated yet. In FIG. 8, after the wafer-level pre-anneal bonding is performed, the semiconductor package 300 is transferred out of the device bonding apparatus 100 and transferred to a heating apparatus, such as a furnace. For example, the semiconductor package 300 may be transferred to the load port 116 in the second chamber 104 by the robot 118 and unloaded. An anneal process may be performed in the heating apparatus for forming bonds, such as fusion bonds, hybrid bonds, or the like, between the semiconductor dies 202 and the second wafer 230. The anneal process may cause the inter-diffusion of the metals in bond pads 238 of the second wafer 230 and the corresponding overlying bond pads 218 of the semiconductor die 202 and make their interface become indistinguishable. The anneal process may also form oxide-oxide bonds between the surface dielectric layer 236 of the second wafer 230 and the surface dielectric layer 216 of the semiconductor die 202. The annealing temperature may be in the range between 200° and 400° C. in accordance with some embodiments. The annealing time may be in the range between 1.5 hours and 12 hours, such as in the range between 3 hours and 9 hours in accordance with some embodiments.

Figure 9:
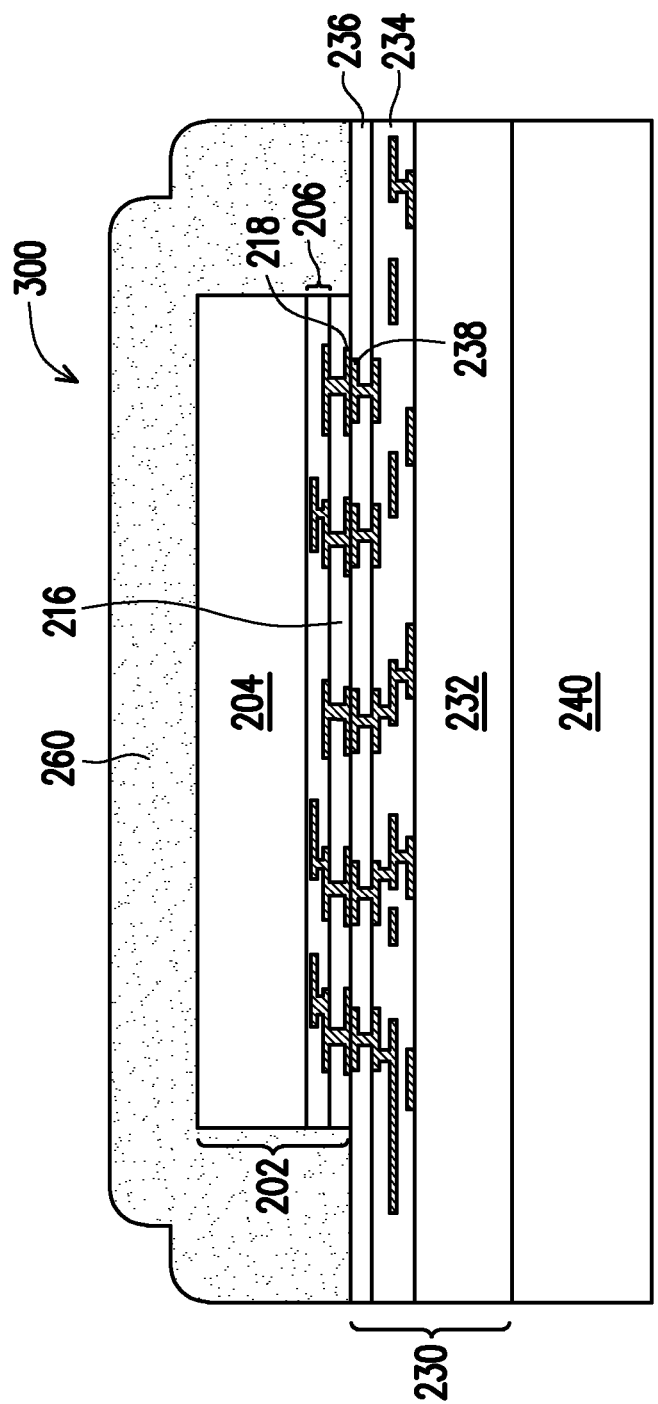

In FIG. 9, a dielectric layer 260 is formed over the second wafer 230 and the semiconductor dies 202, in accordance with some embodiments. The dielectric layer 260 may fill gaps between adjacent semiconductor dies 202 and be over top surfaces of the semiconductor dies 202, in accordance with some embodiments. The dielectric layer 260 may be formed by a deposition method, such as chemical vapor deposition (CVD), spin coating, a combination thereof, or the like. In accordance with some embodiments of the present disclosure, the dielectric layer 260 is formed of silicon oxide, which may be formed of TEOS, although other dielectric materials such as silicon carbide, silicon oxynitride, silicon oxy-carbo-nitride, PSG, BSG, BPSG, or the like may be utilized. The dielectric layer 260 may be formed using CVD, High-Density Plasma Chemical Vapor Deposition (HDPCVD), Flowable Chemical Vapor Deposition (CVD), spin-on coating, or the like.

Performing the second pre-anneal bonding process helps eliminate (or at least reduce) the gaps G (e.g., see FIG. 6), thereby reducing the risk of the dielectric layer 260 may extending into the gaps G. If too much of the dielectric layer 260 were formed extending into the gaps G, it may block the electrical connections between the bond pads 218 and the bond pads 238 and may generate stress to break apart the bonds between the semiconductor die 202 and the second wafer 230. As such, performing the second pre-anneal bonding process may help increase device reliability.

Figure 10:
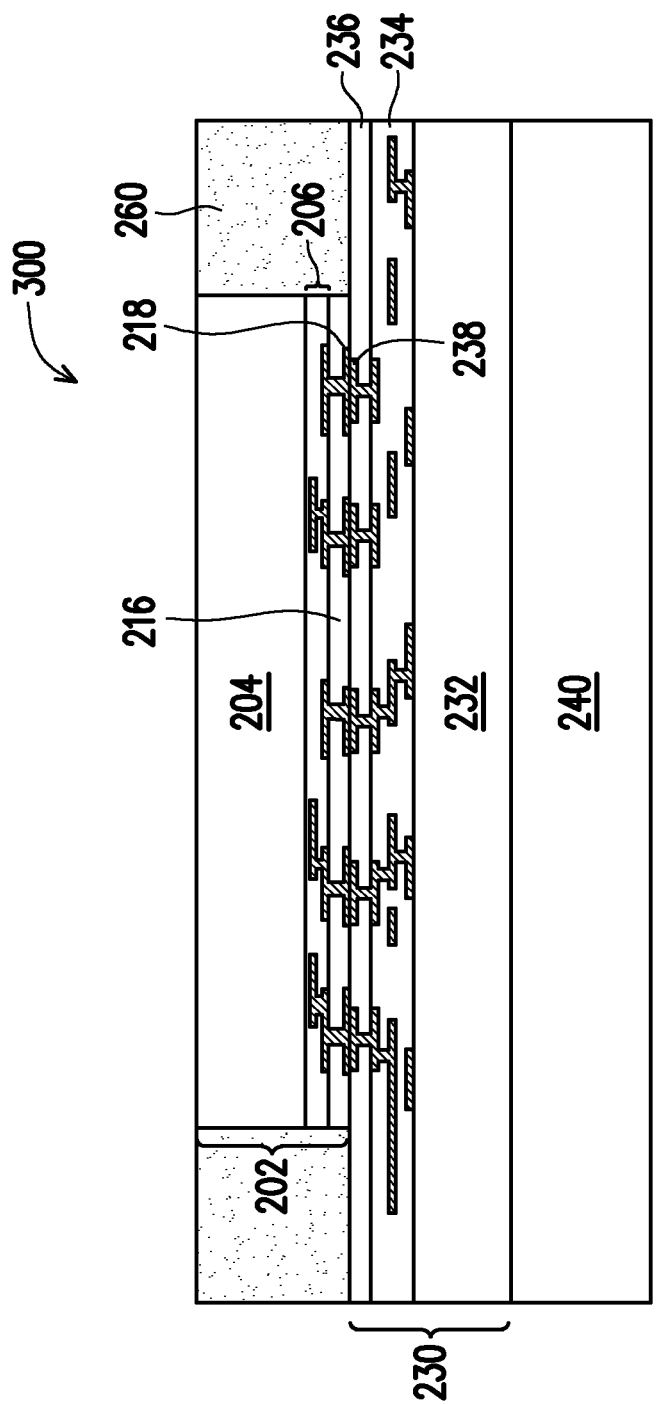

In FIG. 10, a backside thinning process may be performed on the semiconductor die 202 and the dielectric layer 260, in accordance with some embodiments. The backside thinning may be performed by a planarization process or a combination of an etching process and the planarization process. For example, in an embodiment in which the etching process is performed, a patterned mask (not shown), such as a patterned photoresist, is formed above the semiconductor die 202. The etching process is then performed for removing a portion of the dielectric layer 260 above and adjacent the semiconductor die 202 and removing a first portion of the semiconductor substrate 204 of the semiconductor die 202. The patterned mask is then removed, and the planarization is performed for removing a portion of the dielectric layer 260 above and adjacent the semiconductor die 202 and removing a second portion of the semiconductor substrate 204 of the semiconductor die 202. In some embodiments, the first portion being removed is greater than the second portion being removed. In some embodiments, the etching process includes etching the dielectric layer 260 and the semiconductor die 202 using a gas etchant comprising fluorine or other suitable gas, such as a mixture of $NF_3$ and $NH_3$, or a mixture of HF and $NH_3$, or using a liquid etchant such as HF. The planarization process may include chemical mechanical polish (CMP) or mechanical grinding. After the backside thinning process, top surfaces (e.g., the inactive surfaces) of the semiconductor dies 202 may be substantially level with a top surface of the dielectric layer 260.

Figure 11:
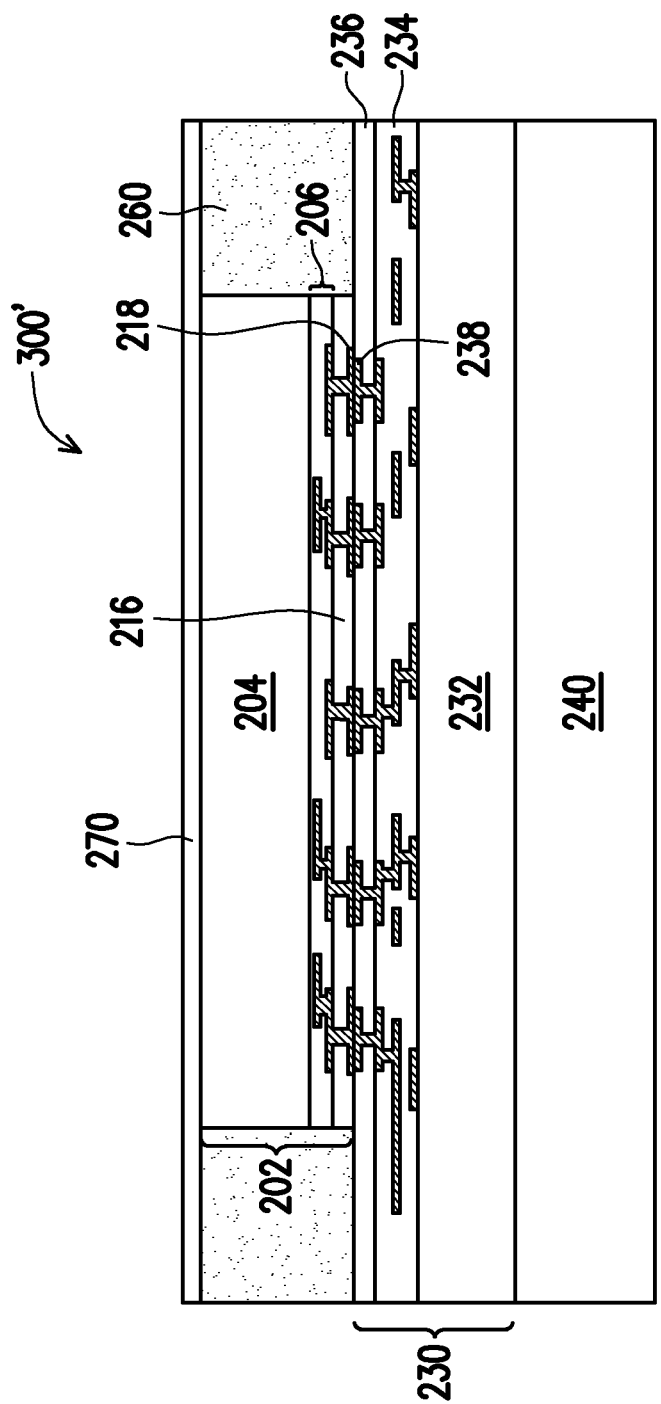

In FIG. 11, a passivation layer 270 is formed over the dielectric layer 260 and the semiconductor die 202 in accordance with some embodiments. In some embodiments, the passivation layer 270 is a single layer such as a silicon nitride layer, a silicon oxynitride layer, a composite layer such as a silicon nitride layer (not shown separately) over a silicon oxide layer (not shown separately). In accordance with some embodiments of the present disclosure, the method proceeding from FIGS. 3 to 11 is at a wafer level, and a singulation process may be performed for separating the semiconductor package 300 into a plurality of semiconductor packages 300'. The carrier substrate 240 may be removed from the semiconductor substrate 232 before the singulation process is performed. Each of the individual semiconductor packages 300' may be the semiconductor package 300' as illustrated in FIG. 11, though each of the individual semiconductor packages 300' may include more than one semiconductor dies 202.

In accordance with some embodiments, a device bonding apparatus is provided. The device bonding apparatus includes a first bond head and a second bond head. The first bond head may provide an attaching force for collecting a semiconductor die. The second bond head may include an elastic head for providing a downward force on the edge portion of the semiconductor die. In some embodiments, a two-stage pre-anneal bonding process that uses the first bond head and the second bond head for applying different downward forces for bonding a semiconductor and a wafer may be performed. Gaps formed between the semiconductor die and the wafer resulting from the warpage of the semiconductor die may be reduced or eliminated, and the process yield and reliability of the bonding may be improved.

In an embodiment, a device bonding apparatus is provided. The device bonding apparatus includes a first process station configured to receive a wafer; a first bond head configured to carry a die to the wafer, wherein the first bonding head includes a first rigid body and a vacuum channel in the first rigid body for providing an attaching force for carrying the die to the wafer; and a second bond head configured to press the die against the wafer, the second bond head including a second rigid body and an elastic head disposed over the second rigid body for pressing the die, the elastic head having a center portion and an edge portion surrounding the center portion, the center portion of the elastic head having a first thickness, the edge portion of the elastic head having a second thickness, the second thickness being greater than the second thickness. In an embodiment, the elastic head includes rubber or an elastic material. In an embodiment, the edge portion of the elastic head has a ring shape in a plan view. In an embodiment, the edge portion of the elastic head has a width in a range from 200 um to 10000 um. In an embodiment, the center portion of the elastic head has a bowl shape. In an embodiment, the edge portion of the elastic head has a flat surface facing away from the second rigid body. In an embodiment, the center portion of the elastic head has a curved surface facing away from the second rigid body. In an embodiment, the second bond head includes an optical sensor disposed on a sidewall of the second rigid body, wherein the second sensor is configured to measure a tilt angle of the wafer with respect to a surface of the second rigid body facing the elastic head.

In an embodiment, a method for forming a package is provided. The method includes placing a die onto a device wafer by a first bond head; applying a first force on the die and against the device wafer by the first bond head; applying a second force on the die and against the device wafer by a second bond head, wherein the second bond head includes an elastic head, and the elastic head includes a bottom surface, the bottom surface including a center portion and a peripheral portion surrounding the center portion, wherein the center portion of the bottom surface of the second bond head is concave, and wherein the peripheral portion of the bottom surface of the second bond head is flat; and performing an anneal for bonding the die and the device wafer. In an embodiment, the second force is greater than the first force. In an embodiment, the method further includes heating the die with the second bond head. In an embodiment, while applying the second force, the peripheral portion of the bottom surface contacts the die, and the center portion of the bottom surface is spaced apart from the die. In an embodiment, the second bond head includes a rigid body and the elastic head disposed over the rigid body, wherein the elastic head includes rubber or an elastic material. In an embodiment, the peripheral portion of the bottom surface of the second bond head has a first ring shape that has a first width in a plan view, and a contact area of the die and the peripheral portion of the second bond head when applying the second force has a second ring shape that has a second width, wherein the second width is ⅓ to ⅔ of the first width. In an embodiment, while applying the second force, a distance from an outer edge of the contact area to an outer edge of the first ring shape is in a range from 100 μm to 5000 μm.

In an embodiment, a method of forming a package is provided. The method includes placing a wafer in a first process station; placing a semiconductor die onto the wafer; applying a first force to a center portion of the semiconductor die by a first bond head; applying a second force to an edge portion of the semiconductor die by a second bond head, wherein the second force is greater than the first force; and annealing the semiconductor die and the wafer. In an embodiment, the edge portion of the semiconductor die has a spacing gap with the wafer after applying the first force and before applying the second force. In an embodiment, the spacing gap is reduced by applying the second force. In an embodiment, the first force and the second force are both applied in the first process station. In an embodiment, the first force is applied in the first process station, and the second force is applied in a second process station different from the first process station.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device bonding apparatus, comprising:
   a first process station configured to receive a wafer;
   a first bond head configured to carry a die to the wafer, wherein the first bonding head comprises a first rigid body and a vacuum channel in the first rigid body for providing an attaching force for carrying the die to the wafer; and
   a second bond head configured to press the die against the wafer, the second bond head comprising a second rigid body and an elastic head disposed over the second rigid body for pressing the die, the elastic head having a center portion and an edge portion surrounding the center portion, the center portion of the elastic head having a first thickness, the edge portion of the elastic head having a second thickness, the second thickness being greater than the first thickness.

2. The device bonding apparatus of claim 1, wherein the elastic head comprises rubber or an elastic material.

3. The device bonding apparatus of claim 1, wherein the edge portion of the elastic head has a ring shape in a plan view.

4. The device bonding apparatus of claim 3, wherein the edge portion of the elastic head has a width in a range from 200 um to 10000 um.

5. The device bonding apparatus of claim 1, wherein the center portion of the elastic head has a bowl shape.

6. The device bonding apparatus of claim 1, wherein the edge portion of the elastic head has a flat surface facing away from the second rigid body.

7. The device bonding apparatus of claim 1, wherein the center portion of the elastic head has a curved surface facing away from the second rigid body.

8. The device bonding apparatus of claim 1, wherein the second bond head comprises an optical sensor disposed on a sidewall of the second rigid body, wherein the optical sensor is configured to measure a tilt angle of the wafer with respect to a surface of the second rigid body facing the elastic head.

9. A method for forming a package, the method comprising:
   placing a die onto a device wafer by a first bond head;
   applying a first force on the die and against the device wafer by the first bond head;
   applying a second force on the die and against the device wafer by a second bond head, wherein the second bond head comprises an elastic head, and the elastic head comprises a bottom surface, the bottom surface comprising a center portion and a peripheral portion surrounding the center portion, wherein the center portion of the bottom surface of the second bond head is concave, and wherein the peripheral portion of the bottom surface of the second bond head is flat; and
   performing an anneal for bonding the die and the device wafer.

10. The method of claim 9, wherein the second force is greater than the first force.

11. The method of claim 9 further comprising heating the die with the second bond head.

12. The method of claim 9, wherein while applying the second force, the peripheral portion of the bottom surface contacts the die, and the center portion of the bottom surface is spaced apart from the die.

13. The method of claim 9, wherein the second bond head comprises a rigid body and the elastic head disposed over the rigid body, wherein the elastic head comprises rubber or an elastic material.

14. The method of claim 9, wherein the peripheral portion of the bottom surface of the second bond head has a first ring shape that has a first width in a plan view, and a contact area of the die and the peripheral portion of the second bond head when applying the second force has a second ring shape that has a second width, wherein the second width is ⅓ to ⅔ of the first width.

15. The method of claim 14, wherein while applying the second force, a distance from an outer edge of the contact area to an outer edge of the first ring shape is in a range from 100 μm to 5000 μm.

16. A method of forming a package, the method comprising:
   placing a wafer in a first process station;
   placing a semiconductor die onto the wafer;
   applying a first force to a center portion of the semiconductor die by a first bond head;
   applying a second force to an edge portion of the semiconductor die by a second bond head, wherein the second force is greater than the first force; and
   annealing the semiconductor die and the wafer.

17. The method of claim 16, wherein the edge portion of the semiconductor die has a spacing gap with the wafer after applying the first force and before applying the second force.

18. The method of claim 17, wherein the spacing gap is reduced by applying the second force.

19. The method of claim 16, wherein the first force and the second force are both applied in the first process station.

20. The method of claim 16, wherein the first force is applied in the first process station, and the second force is applied in a second process station different from the first process station.

* * * * *